United States Patent
Kim et al.

(10) Patent No.: US 9,513,729 B2
(45) Date of Patent: Dec. 6, 2016

(54) ENERGY RECOVERY SYSTEM FOR RECOVERING PRESSURE ENERGY OF TOUCH INPUT TO TOUCH SCREEN PANEL

(71) Applicant: Samsung Display Co., LTD., Yongin, Gyeonggi-Do (KR)

(72) Inventors: Beom-Shik Kim, Yongin (KR); Hui Nam, Yongin (KR); Jun-Il Kwon, Yongin (KR)

(73) Assignee: Samsung Display Co., Ltd., Samsung-ro, Giheung-Gu, Yongin-si, Gyeonggi-Do (KR)

( * ) Notice: Subject to any disclaimer, the term of this patent is extended or adjusted under 35 U.S.C. 154(b) by 334 days.

(21) Appl. No.: 14/098,813

(22) Filed: Dec. 6, 2013

(65) Prior Publication Data
US 2014/0293155 A1    Oct. 2, 2014

(30) Foreign Application Priority Data
Apr. 2, 2013    (KR) .................. 10-2013-0035924

(51) Int. Cl.
*H01L 41/113* (2006.01)
*G06F 3/041* (2006.01)
*H02N 2/18* (2006.01)

(52) U.S. Cl.
CPC ............ *G06F 3/041* (2013.01); *H01L 41/113* (2013.01); *H02N 2/18* (2013.01)

(58) Field of Classification Search
CPC ...... H02N 2/18; H01L 41/113; H01L 41/1132; H01L 41/1134; H01L 41/1136; H01L 41/1138; G06F 3/041

USPC .......................................................... 310/339
See application file for complete search history.

(56) References Cited

U.S. PATENT DOCUMENTS

| 4,825,227 | A | * | 4/1989 | Fischbeck | ............ | B41J 2/14209 310/333 |
|---|---|---|---|---|---|---|
| 5,942,733 | A | | 8/1999 | Allen et al. | | |
| 8,120,587 | B2 | * | 2/2012 | Kim | ............ | G06F 3/0414 345/173 |
| 8,169,416 | B2 | | 5/2012 | Han | | |
| 8,970,513 | B2 | * | 3/2015 | Kwon | ............ | G06F 3/016 345/173 |
| 9,128,547 | B2 | * | 9/2015 | Kodani | ............ | G06F 3/041 |
| 2009/0047453 | A1 | * | 2/2009 | Folaron | ............ | B61D 49/00 428/34.1 |
| 2011/0285660 | A1 | | 11/2011 | Prabhu et al. | | |
| 2012/0013573 | A1 | | 1/2012 | Liu et al. | | |
| 2012/0068965 | A1 | | 3/2012 | Wada et al. | | |

FOREIGN PATENT DOCUMENTS

| KR | 10-2009-0105448 A | 10/2009 |
|---|---|---|
| KR | 10-2012-0001736 A | 1/2012 |
| KR | 10-2012-0029994 A | 3/2012 |

* cited by examiner

Primary Examiner — Derek Rosenau
(74) Attorney, Agent, or Firm — Robert E. Bushnell, Esq.

(57) ABSTRACT

Embodiments provide the energy recovery system capable of converting mechanical energy of a touch input to a touch screen panel into electrical energy and storing the converted electrical energy. The energy recovery system may include a touch screen panel including a piezoelectric material, an energy recovery device recovering electrical energy generated by the piezoelectric material, and an electrical energy storage device storing the recovered electrical energy.

8 Claims, 1 Drawing Sheet

ENERGY RECOVERY SYSTEM FOR RECOVERING PRESSURE ENERGY OF TOUCH INPUT TO TOUCH SCREEN PANEL

CLAIM OF PRIORITY

This application claims priority to and the benefit of Korean Patent Application No. 10-2013-0035924, filed on Apr. 2, 2013, in the Korean Intellectual Property Office, the entire contents of which are incorporated herein by reference in their entirety.

BACKGROUND OF THE INVENTION

Field of the Invention

Embodiments of the present invention generally relate to an energy recovery system for recovering mechanical energy of touch input to a touch screen panel, and more specifically, to an energy recovery system for recovering mechanical energy of touch input to a touch screen panel including a piezoelectric layer.

Description of the Related Art

A touch screen panel is an input device that allows a user's instruction to be input by selecting an instruction content displayed on a screen of a display device or the like with a user's hand or object.

To this end, the touch screen panel is formed on a front face of the display device to convert a contact position into an electrical signal. Here, the user's hand or object is directly in contact with the touch screen panel at the contact position. Accordingly, the instruction content selected at the contact position is input as an input signal to the image display device. Since such a touch screen panel can be substituted for a separate input device connected to a display device, such as a keyboard or mouse, its application fields have been gradually extended.

Meanwhile, with the development of technologies in electronic and communication fields, the use of a mobile device, e.g., a smart phone or tablet PC has recently been increased. The mobile device receives electrical energy supplied from a battery built therein. Studies on a technique for increasing electrical capacity of a battery or decreasing power consumption of a mobile device so as to increase the use time of the mobile terminal have been actively conducted, but studies on a technique for producing electrical energy from the use of a mobile device have hardly been conducted.

SUMMARY OF THE INVENTION

Embodiments provide an energy recovery system capable of converting mechanical energy of a touch input to a touch screen panel into electrical energy and storing the converted electrical energy.

According to an aspect of the present invention, an energy recovery system may include a touch screen panel including a piezoelectric material, an energy recovery device recovering electrical energy generated by the piezoelectric material, and an electrical energy storage device storing the recovered electrical energy.

According to an embodiment, the touch screen panel may include a first substrate, a first electrode formed on the first substrate, a piezoelectric layer formed on the first electrode and including the piezoelectric material, a second electrode formed on the piezoelectric layer, and a second substrate formed on the second electrode.

The touch screen panel may further include a first insulation layer formed between the first electrode and the piezoelectric layer; and a second insulation layer formed between the second electrode and the piezoelectric layer.

The piezoelectric material may be disposed in a pillar shape between the first and second insulation layers.

The piezoelectric layer may further include a plurality of spacers arranged between the first and second insulation layers.

According to another embodiment, the touch screen panel may include a first substrate, a piezoelectric layer formed on the first substrate and including the piezoelectric material, a first electrode formed on the piezoelectric material, an elastic deformation layer formed on the first electrode, a second electrode formed on the elastic deformation layer, and a second substrate formed on the second electrode.

The touch screen panel may further include an insulation layer formed between the piezoelectric layer and the first electrode.

According to still another embodiment, the touch screen panel may include a first substrate, a first electrode formed on the first substrate, a piezoelectric layer formed on the first electrode and including the piezoelectric material, a second electrode formed on the piezoelectric layer, and a second substrate formed on the second electrode.

The touch screen panel may further include a first insulation layer formed between the first electrode and the piezoelectric layer; and a second insulation layer formed between the second electrode and the piezoelectric layer.

The piezoelectric layer may be made of a mixture of the piezoelectric material and the elastic deformation material.

The piezoelectric material may have elastic deformation characteristics.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

Figure 1:
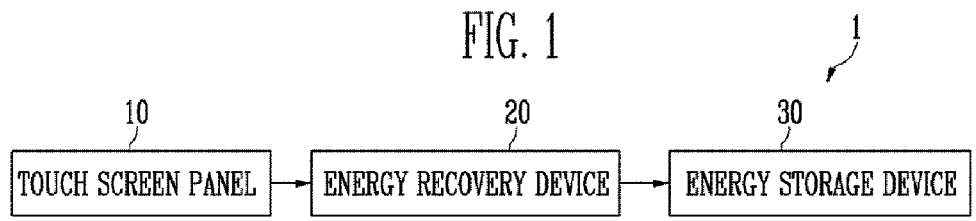
FIG. 1 is a block diagram showing an energy recovery system constructed as an embodiment according to the principles of the present invention.

In the following detailed description, only certain exemplary embodiments of the present invention have been shown and described, simply by way of illustration. As those skilled in the art would realize, the described embodiments may be modified in various different ways, all without departing from the spirit or scope of the present invention. Accordingly, the drawings and description are to be regarded as illustrative in nature and not restrictive. In addition, when an element is referred to as being "on" another element, it can be directly on the another element or be indirectly on the another element with one or more intervening elements interposed therebetween. Also, when an element is referred to as being "connected to" another element, it can be directly connected to the another element or be indirectly connected to the another element with one or more intervening elements interposed therebetween. Hereinafter, like reference numerals refer to like elements.

FIG. 1 is a block diagram showing an energy recovery system constructed as an embodiment according to the principles of the present invention.

Referring to FIG. 1, an energy recovery system 1 includes a touch screen panel 10, an energy recovery device 20 and an energy storage device 30.

The touch screen panel 10 is disposed on a front face of a display device in a mobile device. The touch screen panel 10 recognizes a user's touch input to the display device and transmits a coordinate value of the recognized touch input to a processor (not shown). In this case, the processor performs a process corresponding to the coordinate value received from the touch screen panel 10.

The touch screen panel 10 may include a piezoelectric material. The piezoelectric material converts mechanical energy into electrical energy. That is, the piezoelectric material outputs current having a voltage value corresponding to a mechanical strain applied to the piezoelectric material. The piezoelectric material may be a mixture configured with one or a combination of two or more among materials having piezoelectric characteristics, such as crystal, ceramic and biological matter.

The energy recovery device 20 recovers electrical energy generated by the piezoelectric material included in the touch screen panel 10. Specifically, the energy recovery device 20 receives current output from the piezoelectric material, and rectifies the received current to be output to the energy storage device 30.

The energy storage device 30 receives the current rectified from the energy recovery device 20, and stores the electrical energy converted by the piezoelectric material. The energy storage device 30 supplies the stored energy to the mobile device including the energy recovery system 1.

In FIG. 1, the energy recovery device 20 and the energy storage device 30 are distinguished as circuits separated from each other, but the technical spirit of the present invention is not limited thereto. For example, the energy recovery device 20 and the energy storage device 30 may be implemented as one circuit.

Figure 2:
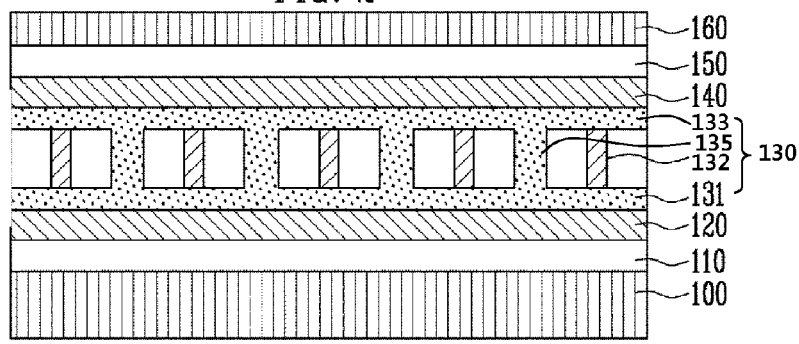
FIG. 2 is a sectional view showing an embodiment of a touch screen panel shown in FIG. 1.

FIG. 2 is a sectional view schematically showing an embodiment of a touch screen panel shown in FIG. 1.

Referring to FIG. 2, the touch screen panel 10 includes a first substrate 100, a first electrode 110, a piezoelectric element 130, a second electrode 150, and a second substrate 160.

The first and second substrates 100 and 160 support other components 110, 120, 130, 140 and 150 of the touch screen panel 10. Each of the first and second substrates 100 and 160 may be implemented with a transparent glass substrate or plastic substrate.

As shown in FIG. 2, the first electrode 110 is formed on the first substrate 100, and the second electrode 150 is formed beneath the second substrate 160. The touch screen panel 10 recognizes a user's touch input according to a change in dielectric constant between the first and second electrodes 110 and 150, and outputs a coordinate value of the recognized touch input to the processor. The first and second electrodes 110 and 150 may be made of a transparent metal.

The piezoelectric element 130 converts mechanical energy of the user's touch input into electrical energy, and supplies the converted electrical energy to the energy recovery device 20.

The first electrode 110 and the piezoelectric element 130 are electrically connected to each other, and the second electrode 150 and the piezoelectric element 130 are electrically connected to each other. To this end, the touch screen panel 10 may include a first insulation layer 120 formed between the first electrode 110 and the piezoelectric element 130, and a second insulation layer 140 formed between the second electrode 150 and the piezoelectric element 130.

The piezoelectric element 130 includes a first piezoelectric plate 131, a second piezoelectric plate 133 spaced-apart from the first piezoelectric plate 131, a plurality of piezoelectric pillars 135, and a plurality of spacers 132 made of an elastic deformation material. The first and second piezoelectric plates 131 and 133 may be disposed parallel to each other. The plurality of piezoelectric pillars 135 and the plurality of spacers 132 are interposed between the first piezoelectric plate 131 and the second piezoelectric plate 133. More specifically, the plurality of spacers may be dispersed among the plurality of piezoelectric pillars 135. Each spacer 132 may be disposed spaced-apart from immediately adjacent piezoelectric pillars 135. The piezoelectric element 130 continuously extends across the entire area of the touch screen panel 10, or at least continuously extends across the display area of the touch screen panel 10.

The first piezoelectric plate 131 is formed between the first insulation layer 120, and the plurality of piezoelectric pillars 135 and spacers 132, and is electrically connected to one input terminal (not shown) of the energy recovery device 20. The piezoelectric plate 133 is formed between the second insulation layer 140, and the plurality of piezoelectric pillars 135 and spacers 132, and is electrically connected to another input terminal (not shown) of the energy recovery device 20. If a user's touch input is applied, the first and second piezoelectric plates 131 and 133 and the plurality of piezoelectric pillars 135 convert mechanical energy of the touch input into electrical energy according characteristics of the piezoelectric material, and supplies the converted electrical energy to the energy recovery device 20. Alternatively, the first and second piezoelectric plates 131 and 133 may not be included in the piezoelectric element 130. Thus, the plurality of piezoelectric pillars 135 and spacers 132 are formed directly between the first and second insulation layer 120 and 140.

The plurality of spacers 132 are formed in a pillar shape between the first and second insulation layers 120 and 140. The plurality of spacers 132 restores deformation of the touch screen panel according to the user's touch input.

Figure 3:
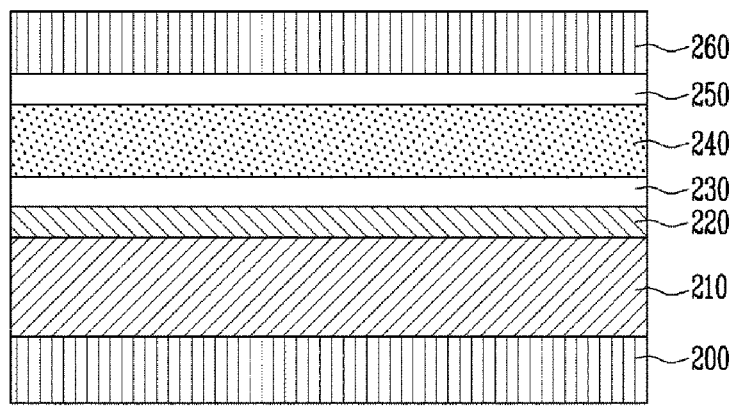
FIG. 3 is a sectional view showing another embodiment of the touch screen panel shown in FIG. 1.

FIG. 3 is a sectional view schematically showing another embodiment of the touch screen panel shown in FIG. 1.

Referring to FIG. 3, the touch screen panel 10 includes a first substrate 200, a piezoelectric layer 210, a first electrode 230, an elastic deformation layer 240, a second electrode 250 and a second substrate 260.

The first and second substrates 200 and 260 support other components 210, 220, 230, 240, 250 and 260 of the touch screen panel 10. Each of the first and second substrates 200 and 260 may be implemented as a transparent glass substrate or plastic substrate.

The piezoelectric layer 210 is formed on the first substrate 200, and is made of a piezoelectric material. The piezoelectric layer 210 is electrically connected to the energy recovery device 20. If a user's touch input is applied, the piezoelectric layer 210 converts mechanical energy of the touch input into electrical energy according to characteristics of the piezoelectric material, and supplies the converted electrical energy to the energy recovery device 20. The piezoelectric layer 210 continuously extends across the entire area of the touch screen panel 10, or at least continuously extends across the display area of the touch screen panel 10.

The first electrode 230 is formed on the piezoelectric layer 210, and the second electrode 250 is formed beneath the second substrate 260. The touch screen panel 10 recognizes a user's touch input according to a change in dielectric constant between the first and second electrodes 230 and 250, and outputs a coordinate value of the recognized touch input to the processor. The first and second electrodes 230 and 250 may be made of a transparent metal.

The piezoelectric layer 210 and the first electrode 230 are electrically connected to each other. To this end, the touch screen panel 10 may include an insulation layer 220 formed between the piezoelectric layer 210 and the first electrode 230.

The elastic deformation layer 240 is formed between the first and second electrodes 230 and 250. The elastic deformation layer 240 is made of an elastic deformation material, for example, silicone or polymer material such as polyurethane, so as to restore deformation of the touch screen panel according to the user's touch input. Young's modulus of the elastic deformation layer may be about 2000 kg/cm$^2$.

Figure 4:
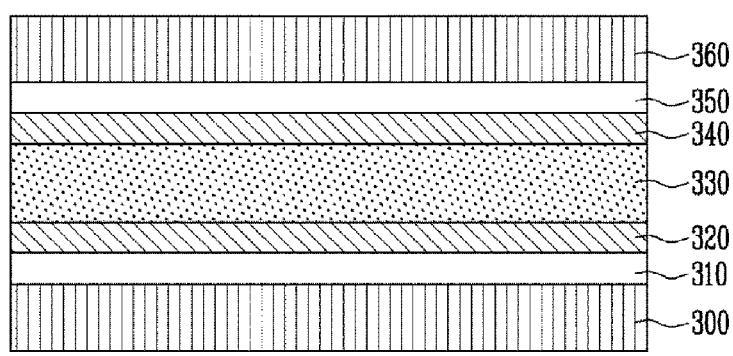
FIG. 4 is a sectional view showing still another embodiment of the touch screen panel shown in FIG. 1.

FIG. 4 is a sectional view showing still another embodiment of the touch screen panel shown in FIG. 1.

Referring to FIG. 4, the touch screen panel 10 includes a first substrate 300, a first electrode 310, a piezoelectric layer 330, a second electrode 350 and a second substrate 360.

The first and second substrates 300 and 360 support other components 310, 320, 330, 340 and 350 of the touch screen panel 10. Each of the first and second substrates 300 and 360 may be implemented as a transparent glass substrate or plastic substrate.

The first electrode 310 is formed on the first substrate 300, and the second electrode 350 is formed beneath the second substrate 360. The touch screen panel 10 recognizes a user's touch input according to a change in dielectric constant between the first and second electrodes 310 and 350, and outputs a coordinate value of the recognized touch input to the process. The first and second electrodes 230 and 250 may be made of a transparent metal.

The piezoelectric layer 330 is formed between the first and second electrodes 310 and 350. The piezoelectric layer 330 is made of a mixture of a piezoelectric material and an elastic deformation material. The piezoelectric layer 330 is electrically connected to the energy recovery device 20. If a user's touch input is applied, the piezoelectric layer 330 converts mechanical energy of the touch input into electrical energy according to characteristics of the piezoelectric material, and supplies the converted electrical energy to the energy recovery device 20. The piezoelectric layer 330 restores deformation of the touch screen panel, caused by the user's touch input, according to elastic deformation characteristics.

The piezoelectric layer 330 and the first electrode 310 are electrically insulated from each other, and the piezoelectric layer 330 and the second electrode 350 are electrically insulated from each other. To this end, the touch screen panel 10 may include a first insulation layer 320 formed between the piezoelectric layer 330 and the first electrode 310, and a second insulation layer 340 formed between the piezoelectric layer 330 and the second electrode 350. The piezoelectric layer 330 continuously extends across the entire area of the touch screen panel 10, or at least continuously extends across the display area of the touch screen panel 10.

The substrates 100, 160, 200, 260, 300 and 360, the electrodes 110, 150, 230, 250, 310 and 350, the insulation layers 120, 140, 220, 320 and 340, the piezoelectric layers 130, 210 and 330, and the elastic deformation layer 240 may be made of a flexible material. That is, the touch screen panel 10 according to this embodiment may have flexibility.

The energy recovery system according to an embodiment converts mechanical energy of a touch input to a touch screen panel into electrical energy and stores the converted electrical energy, thereby increasing the operating time of a mobile device.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An energy recovery system, comprising:
    a touch screen panel including a piezoelectric element extending across a display area of the touch screen panel;
    an energy recovery device recovering electrical energy generated by the piezoelectric element; and
    an electrical energy storage device storing the recovered electrical energy,
    the piezoelectric element including
        a first piezoelectric plate,
        a second piezoelectric plate spaced-apart from the first piezoelectric plate, and
        a plurality of piezoelectric pillars of which each disposed between and contacting the first and second piezoelectric plates, and
        a plurality of spacers spaced-apart from the piezoelectric pillars and disposed between and contacting the first and second piezoelectric plates.

2. The energy recovery system of claim 1, wherein the touch screen panel includes:
    a first substrate;
    a first electrode formed on the first substrate;
    the piezoelectric element formed on the first electrode;
    a second electrode formed on the piezoelectric element; and
    a second substrate formed on the second electrode.

3. The energy recovery system of claim 2, wherein the touch screen panel further includes:
    a first insulation layer interposed between the first electrode and the piezoelectric element; and
    a second insulation layer interposed between the second electrode and the piezoelectric element.

4. The energy recovery system of claim 3, wherein the piezoelectric pillars interposed between the first and second insulation layers.

5. The energy recovery system of claim 4, wherein the plurality of spacers interposed between the first and second insulation layers.

6. The energy recovery system of claim 1, wherein the piezoelectric element is made of a mixture of a piezoelectric material and an elastic deformation material.

7. The energy recovery system of claim 1, wherein the piezoelectric element has elastic deformation characteristics.

8. An energy recovery system, comprising:
- a touch screen panel including a piezoelectric element extending across a display area of the touch screen panel;
- an energy recovery device recovering electrical energy generated by the piezoelectric element; and
- an electrical energy storage device storing the recovered electrical energy,
- wherein the touch screen panel includes:
  - a first substrate;
  - the piezoelectric element formed on the first substrate;
  - a first electrode formed on the piezoelectric element;
  - an elastic deformation layer formed on the first electrode and separated from the piezoelectric element;
  - a second electrode formed on the elastic deformation layer; and
  - a second substrate formed on the second electrode,
  - wherein the touch screen panel further includes an insulation layer interposed between the piezoelectric element and the first electrode and below the first and second electrodes.

* * * * *